United States Patent
Haq et al.

(10) Patent No.: US 12,207,566 B2
(45) Date of Patent: *Jan. 21, 2025

(54) MTJ DEVICE PERFORMANCE BY ADDING STRESS MODULATION LAYER TO MTJ DEVICE STRUCTURE

(71) Applicant: Taiwan Semiconductor Manufacturing Company, Ltd., Hsin-Chu (TW)

(72) Inventors: Jesmin Haq, Milpitas, CA (US); Tom Zhong, Saratoga, CA (US); Vinh Lam, Dublin, CA (US); Vignesh Sundar, Sunnyvale, CA (US); Zhongjian Teng, Santa Clara, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/359,943

(22) Filed: Jul. 27, 2023

(65) Prior Publication Data
US 2023/0371398 A1 Nov. 16, 2023

Related U.S. Application Data

(60) Continuation of application No. 17/885,079, filed on Aug. 10, 2022, now Pat. No. 11,785,864, which is a
(Continued)

(51) Int. Cl.
*G11B 5/39* (2006.01)
*G11B 5/48* (2006.01)
(Continued)

(52) U.S. Cl.
CPC .......... *H10N 50/80* (2023.02); *G11B 5/3909* (2013.01); *G11B 5/4826* (2013.01);
(Continued)

(58) Field of Classification Search
None
See application file for complete search history.

(56) References Cited

U.S. PATENT DOCUMENTS

| 8,508,984 B2 | 8/2013 | Ranjan et al. |
| 8,552,411 B2 | 10/2013 | Aoyama et al. |

(Continued)

FOREIGN PATENT DOCUMENTS

JP 2014154604 A 8/2014

OTHER PUBLICATIONS

English Translation as used in Rejection; 2014154604 to Iba Yoshihisa, Published Aug. 25, 2014 (Year: 2014).

*Primary Examiner* — William J Klimowicz
(74) *Attorney, Agent, or Firm* — HAYNES AND BOONE, LLP

(57) ABSTRACT

A magnetic tunneling junction (MTJ) structure is described. The MJT structure includes a stress modulating layer on a first electrode layer, where a material of the stress modulating layer is different from a material of the first electrode layer. The MJT structure further includes a MTJ material stack on the stress modulating layer. And the MJT structure further includes a second electrode layer on the MTJ material stack. The stress modulating layer reduces crystal growth defects and interfacial defects during annealing and improve the interface lattice epitaxy. This will improve device performance.

20 Claims, 4 Drawing Sheets

Related U.S. Application Data continuation of application No. 16/679,498, filed on Nov. 11, 2019, now Pat. No. 11,430,945, which is a division of application No. 15/968,035, filed on May 1, 2018, now Pat. No. 10,475,987.

(51) Int. Cl.
  *G11B 5/60* (2006.01)
  *G11B 19/20* (2006.01)
  *H10N 50/01* (2023.01)
  *H10N 50/80* (2023.01)

(52) U.S. Cl.
  CPC ........ *G11B 5/6082* (2013.01); *G11B 19/2009* (2013.01); *H10N 50/01* (2023.02)

(56) References Cited

U.S. PATENT DOCUMENTS

| | | | |
|---|---|---|---|
| 9,000,545 B2 | 4/2015 | Kajiyama | |
| 9,406,874 B2 | 8/2016 | Kula et al. | |
| 10,475,987 B1* | 11/2019 | Haq | G11B 5/6082 |
| 11,430,945 B2 | 8/2022 | Haq et al. | |
| 2004/0145836 A1 | 7/2004 | Kojima et al. | |
| 2005/0276099 A1* | 12/2005 | Horng | G11C 11/161 |
| | | | 365/158 |
| 2006/0002184 A1* | 1/2006 | Hong | B82Y 40/00 |
| | | | 365/171 |
| 2008/0164548 A1 | 7/2008 | Ranjan et al. | |
| 2008/0225585 A1 | 9/2008 | Ranjan et al. | |
| 2010/0097846 A1 | 4/2010 | Sugiura et al. | |
| 2012/0018825 A1 | 1/2012 | Lim et al. | |
| 2012/0063214 A1 | 3/2012 | Min et al. | |
| 2013/0001721 A1 | 1/2013 | Peng et al. | |
| 2013/0334630 A1 | 12/2013 | Kula et al. | |
| 2014/0175582 A1 | 6/2014 | Apalkov et al. | |
| 2015/0137291 A1 | 5/2015 | Kula et al. | |
| 2017/0117457 A1* | 4/2017 | Noh | G06F 3/0685 |
| 2018/0205009 A1 | 7/2018 | Schafer et al. | |
| 2018/0248114 A1* | 8/2018 | Oguz | H10N 50/01 |
| 2019/0074042 A1 | 3/2019 | Lim et al. | |
| 2019/0148630 A1 | 5/2019 | Haq et al. | |
| 2019/0172997 A1 | 6/2019 | Park et al. | |
| 2019/0341542 A1 | 11/2019 | Haq et al. | |
| 2019/0393410 A1 | 12/2019 | Lee et al. | |
| 2020/0075844 A1 | 5/2020 | Haq et al. | |
| 2021/0143322 A1 | 5/2021 | Sundar et al. | |

* cited by examiner

MTJ DEVICE PERFORMANCE BY ADDING STRESS MODULATION LAYER TO MTJ DEVICE STRUCTURE

PRIORITY DATA

This is a continuation application of U.S. application Ser. No. 17/885,079, filed Aug. 10, 2022, which is a continuation application of U.S. application Ser. No. 16/679,498, filed Nov. 11, 2019, which is a divisional application of U.S. application Ser. No. 15/968,035, filed May 1, 2018 and entitled "Improvement of MTJ Device Performance by Adding Stress Modulation Layer to MTJ Device Structure," each of which is herein incorporated by reference in its entirety.

TECHNICAL FIELD

This application relates to the general field of magnetic tunneling junctions (MTJ) and, more particularly, to customizing the MTJ device structure for improved device performance.

BACKGROUND

Magnetic memory devices consist of a stack of layers in which two ferromagnetic layers, typically referred to as a reference layer and a free layer, are separated by a thin non-magnetic dielectric layer referred to as a barrier layer. It is challenging to achieve high Tunneling Magneto Resistance (MIR) values due to imperfections in interface quality and defects in crystal growth of materials. The Ferro-magnet and non-magnet barrier layer lattice mismatch and interfacial defects caused by undesirable strain results in degradation of device performance. It is desired to customize the MTJ device structure to reduce the crystal defects and improve the interface lattice epitaxy and hence improve the device performance.

Several patents teach adding stress compensating films to the MTJ structure to exert compensating stress on the structure, including U.S. Pat. No. 9,406,874 (Kula et al) and U.S. Pat. No. 9,000,545 (Kajiyama).

SUMMARY

It is an object of the present disclosure to provide an improved method of forming MTJ structures wherein stress acting on the MTJ device during the manufacturing process is modulated.

Another object of the present disclosure is to provide an improved method of forming MTJ structures wherein a stress-modulating layer is added to the top and/or bottom of the MTJ device to reduce stress during the manufacturing process.

In accordance with the objectives of the present disclosure, a method for fabricating an improved magnetic tunneling junction (MTJ) structure is achieved. A bottom electrode is provided on a substrate. A MTJ stack is deposited on the bottom electrode. A top electrode is deposited on the MTJ stack. A first stress modulating layer is deposited between the bottom electrode and the MTJ stack, or a second stress modulating layer is deposited between the MTJ stack and the top electrode, or both a first stress modulating layer is deposited between the bottom electrode and the MTJ stack and a second stress modulating layer is deposited between the MTJ stack and the top electrode. The top electrode and MTJ stack are patterned and etched to form a MTJ device. The stress modulating layers reduce crystal growth defects and interfacial defects during annealing and improve the interface lattice epitaxy. This will improve device performance.

Also in accordance with the objectives of the present disclosure, a magnetic tunneling junction (MTJ) structure is achieved comprising a bottom electrode on a substrate, a MTJ device on the bottom electrode, a top electrode on the MTJ device, and a first stress modulating layer between the bottom electrode and the MTJ device, or a second stress modulating layer between the MTJ device and the top electrode, or both a first stress modulating layer between the bottom electrode and the MTJ device and a second stress modulating layer between the MTJ device and the top electrode.

BRIEF DESCRIPTION OF THE DRAWINGS

In the accompanying drawings forming a material part of this description, there is shown.

DETAILED DESCRIPTION

The present disclosure provides a customized magnetic memory device structure. The crystalline properties of the structure, especially that of the ferromagnet/MgO barrier interface, play a very critical role in the device performance and the presence of strain in the structure can change the properties of the device significantly. The disclosed new structure adds a thick soft layer to the magnetic memory device that will manipulate the stress acting on the device and hence control the crystal structure growth and interfacial lattice mismatch. This will improve device performance; for example, it will increase the Tunneling Magneto Resistance (TMR) and Coercivity (Hc) of the device.

The present disclosure proposes not to exert compensating stress on the structure, but rather to release the stress of the structure by using a soft layer which may consist of a conductive material such as Zr, Hf, Al, or Mg having a very low modulus of elasticity. The stress in the structure will be released by dissipation of energy through the low modulus stress absorbing material used. Also the local stress in the structure can be uniformly distributed using this low modulus material.

Figure 1:
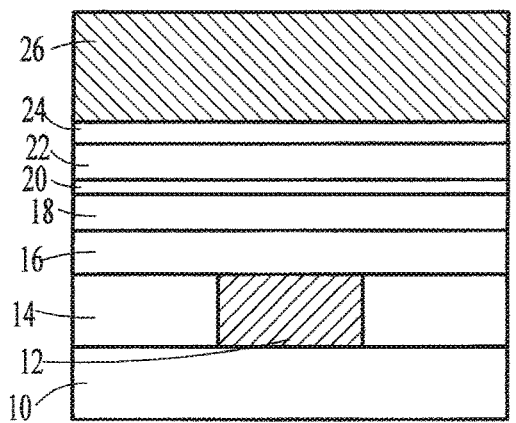
FIG. 1 is a cross-sectional representation of a MTJ stack structure of the prior art.

Magneto resistive tunnel junction (MTJ) devices used in a magnetic random access memory (MRAM) array are formed by depositing a blanket metal stack comprised of a seed layer, a pinned magnetic layer, a tunnel barrier layer, a free magnetic layer and a capping layer on top of a bottom electrode. A hard mask is deposited on top of this stack to transfer the photoresist pattern to the MTJ stack. A standard MTJ film stack is shown in FIG. 1.

Bottom electrode 12 has been formed on the substrate 10, patterned, and surrounded by dielectric material 14. The blanket metal stack comprises seed layer 16, pinned layer 18, barrier layer 20, free layer 22, and cap layer 24. Metal hard mask layer 26 completes the structure. After etching, the remaining metal hard mask will become the top electrode.

The MTJ device undergoes high temperature processes. The MTJ film is annealed at high temperatures for crystallization of the magnetic materials, either just after film deposition or at the end of top electrode integration. Also, back end processing involves high temperature processes which can be simulated as high temperature annealing processes. Since the bottom electrode and top electrode are thick metal layers, they will exert high stress on the MTJ device during the annealing process and can change the crystal growth mechanism and device performance significantly. For a desired magnetic orientation in a certain direction, a specific crystal structure is required. Any crystal defect or strain can cause the magnetic orientation to be shifted and result in weak perpendicular magnetic anisotropy (PMA). The shifted magnetic orientation may lower the energy barrier and weaken the thermal stability and may deteriorate data retention of the spin transfer torque (STT) MRAM cell.

The seed layer at the bottom of the MTJ stack helps to promote the growth of large crystal grains on its top surface with correct crystallographic texture. The seed layer under stress can generate more crystal defects. The dislocations and other defects (grain boundaries, twins) pre-existing in the seed layer will continue into the growing crystal over the overlayer. The desired crystal structure growth of the free layer and reference layer during the annealing process also depends on the crystallographic texture of the barrier layer, such as MgO. The MgO layer under stress generated during deposition and/or resulting from a stressed top and bottom electrode will cause crystal defects and these defects will propagate into the adjacent layers. Also, stress can change the lattice parameters which can cause lattice mismatch and can be detrimental to epitaxial growth.

Figure 2:
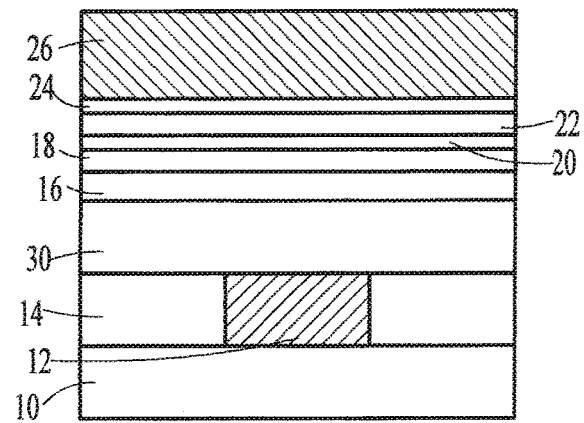
FIG. 2 is a cross-sectional representation of a first preferred embodiment of the present disclosure.

The process of the present disclosure provides a customized MTJ stack. A stress modulation layer is added below the seed layer, or on top of the capping layer, or both below the seed layer and on top of the capping layer. Stress release through the stress modulation layer placed either on top and/or bottom can minimize the stress developed in the MTJ stack and hence improve the crystal structure and reduce the crystal defects. FIG. 2 illustrates the customized MTJ stack according to a first preferred embodiment of the present disclosure.

A blanket bottom electrode is deposited on a CMOS substrate 10 with vias built to connect with the MTJ device. It will be understood that substrate 10 includes standard CMOS metal line connections and vias to connect different metal levels, not shown. The bottom electrode layer is photo patterned and etched to form bottom electrode 12 shown in FIG. 2. The bottom electrodes are covered with a dielectric layer 14. The dielectric layer 14 is flattened and the top of the bottom electrode 12 exposed, for example, by chemical mechanical polishing (CMP).

In the next step, a thick soft material 30 will be deposited on the bottom electrode 12 before the MTJ stack layers are deposited. A material with very low modulus of elasticity can be applied as the soft material; for example Mg can be used or Al, Hf or Zr. The layer 30 should be between about 1 and 100 nm in thickness, and preferably about 10 nm. This soft material will modulate the stress acting on the MTJ device during deposition as well as during high temperature processes.

Now, the magnetic layers including seed layer 16, pinned layer 18, barrier layer 20, free layer 22, capping layer 24, and hard mask layer 26 are deposited as usual.

Figure 3:
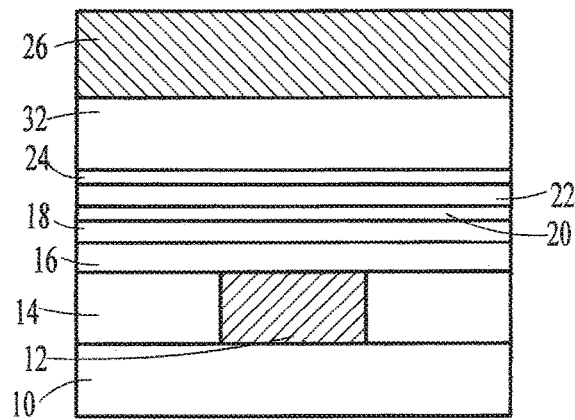
FIG. 3 is a cross-sectional representation of a second preferred embodiment of the present disclosure.

In a second preferred embodiment of the present disclosure, as illustrated in FIG. 3, the seed layer 16, pinned layer 18, barrier layer 20, free layer 22, and capping layer 24 are deposited as usual on the bottom electrode 12 and surrounding dielectric 14. Before depositing the hard mask layer, the thick soft material 32 will be deposited on the capping layer. The layer 32 should be between about 1 and 100 nm in thickness, and preferably about 10 nm. This soft material will modulate the stress acting on the MTJ device as the device undergoes high temperature processes. Finally the hard mask layer 26 is deposited on the thick soft stress modulation layer 32.

Figure 4:
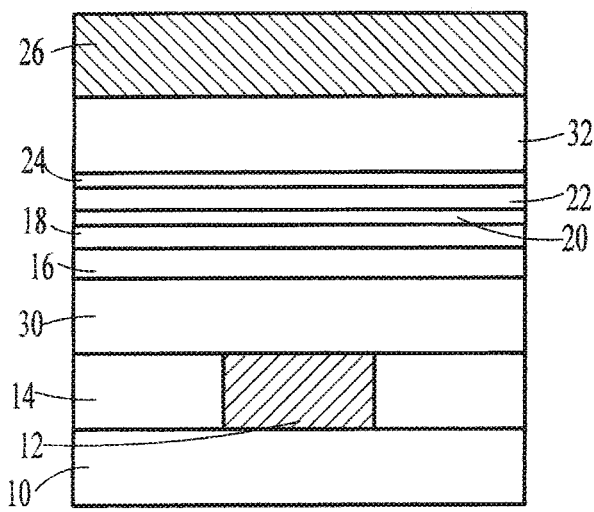
FIG. 4 is a cross-sectional representation of a third preferred embodiment of the present disclosure.

In a third preferred embodiment of the present disclosure, as illustrated in FIG. 4, the thick soft material 30 will be deposited on the bottom electrode 12 before the MTJ stack layers are deposited. Then, the seed layer 16, pinned layer 18, barrier layer 20, free layer 22, and capping layer 24 are deposited as usual on stress modulation layer 30. Before depositing the hard mask layer, the thick soft material layer 32 will be deposited on the capping layer. Finally the hard mask layer 26 is deposited on the thick soft stress modulation layer 32. Sandwiching the MTJ device between the soft materials 30 and 32 will isolate the device from undesired stress during deposition as well as during high temperature processes.

By adjusting the thickness of the soft material, it is possible to introduce controllable mechanical strain on the device. Application of a thin layer of a more flexible material (lower elastic modulus) leads to the same stress relief as thick layers of a less flexible material. Also, the modulus of the soft material can be adjusted by varying deposition conditions to modulate the extent of stress release. The elastic modulus should be between about 20 gigapascals (GPa) and 400 GPa, and preferably about 50 GPa. This will reduce the interfacial and crystal growth defects and hence improve the device performance.

Figure 5:
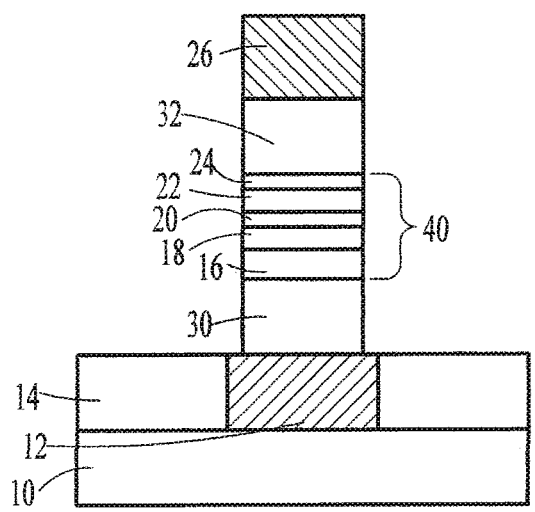
FIG. 5 is a cross-sectional representation of a completed MTJ device of the present disclosure.

FIG. 5 illustrates the completed MTJ device 40 after etching. Stress modulation layers 30 and/or 32 on the bottom and/or top of the MTJ device, respectively, have reduced the crystal growth defects and interfacial defects and improved the interface lattice epitaxy. This will improve the device performance with higher coercivity and TMR values.

The bottom electrode and/or top electrode can have high intrinsic stress material. During annealing and backend processing, the device undergoes high temperature processes which may cause high stress in the device due to thermal expansion coefficient mismatch between layers. Therefore, the dominating stress factor may arise from the bottom electrode below the MTJ stack, and hence, we need to use a bottom stress release layer. Alternatively, the dominating stress factor may arise from the top electrode above the MTJ stack, and hence, we need to use a top stress release layer. Both bottom and top electrodes can play dominating roles to exert stress, so both top and bottom stress release layers may be needed. Also the MTJ stack develops intrinsic stress during deposition which can be released using the top and bottom stress modulating layers.

The epitaxial growth of magnetic layers such as CoFeB and barrier layers such as MgO on top of each other is difficult due to their difference in crystal orientation and structure. There is lattice mismatch between the barrier layer MgO and magnetic layers like CoFe. This lattice mismatch between CoFe and MgO films can cause stress build up in the film and results in structural defects like dislocations and aberrations. These intrinsic stresses in the MTJ stack can be released through the stress modulating layer to reduce crystal defects. Without the stress modulation layer(s) of the present disclosure, these stresses can be released by lateral expansion or contraction which may cause undesirable lateral mismatch between interfacial layers. If the stress is released through the stress absorbing soft layer of the present disclosure, no lateral expansion or contraction will occur or it will be minimized. Furthermore, during backend processing, the device undergoes high temperature processes which may cause high stress in the device due to thermal expansion coefficient mismatch between layers. This thermal stress also can be released through the stress modulating layer.

Figure 6:
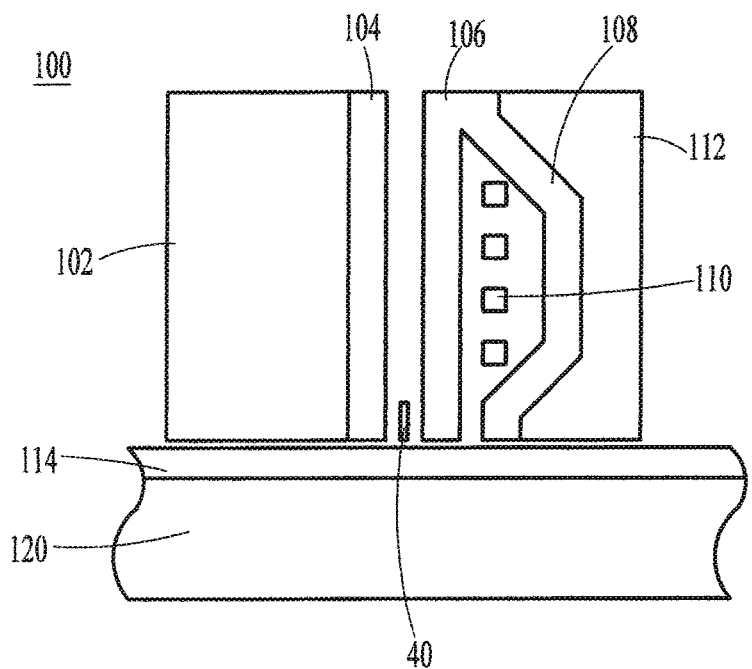
FIG. 6 is a cross-sectional representation of a magnetic recording head incorporating a MTJ device of the present disclosure.
Figure 7:
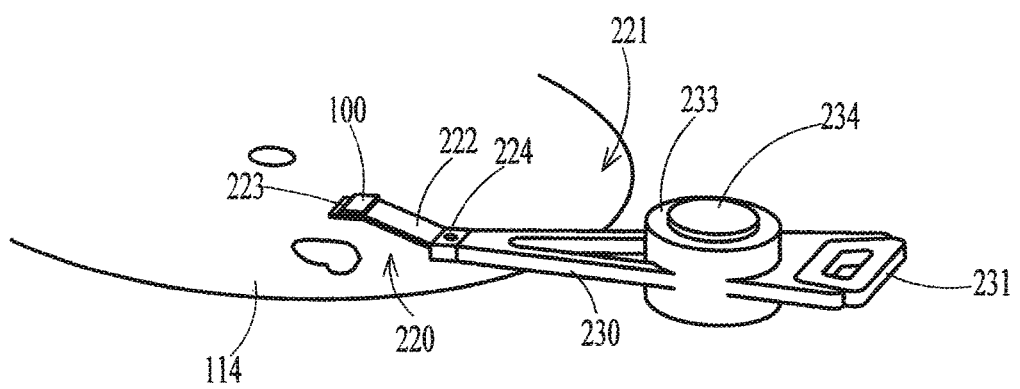
FIG. 7 is a perspective view of a head gimbal assembly incorporating the magnetic recording head of FIG. 6.

The MTJ devices fabricated according to the process of the present disclosure may be used in a magnetic recording head 100, as shown, for example, in FIG. 6. MTJ device 40, for example, used as a read head, is shown between leading shield 104 on wafer substrate 102 and main pole and trailing shield 106. Coils 110 are shown between the mail pole 106 and the secondary pole 108. Magnetic recording medium 114 is shown on disk substrate 120. The magnetic recording head 100 can be used in a head gimbal assembly, as shown in FIG. 7.

A head gimbal assembly (HGA) 220 includes a magnetic recording head 100 and a suspension 221 that elastically supports the magnetic recording head 100. The suspension 221 has a plate spring-like load beam 222 formed with stainless steel, a flexure 223 provided at one end portion of the load beam 222, and a base plate 224 provided at the other end portion of the load beam 222. The magnetic recording head 100 is joined to the flexure 223 which gives an appropriate degree of freedom to the magnetic recording head 100. A gimbal part for maintaining a posture of the magnetic recording head 100 at a steady level is provided in a portion of the flexure 223 to which the magnetic recording head 100 is mounted.

A member to which the HGA 220 is mounted to an arm 230 is referred to as a head arm assembly 221. The arm 230 moves the magnetic recording head 100 in the cross track direction y of the magnetic recording medium 114. One end of the arm 230 is mounted to the base plate 224. A coil 231 to be a portion of a voice coil motor is mounted to the other end of the arm 230. A bearing part 233 is provided in the intermediate portion of the arm 230. The arm 230 is rotatably supported by a shaft 234 mounted to the bearing part 233. The arm 230 and the voice coil motor that drives the arm 230 configure an actuator.

Figure 8:
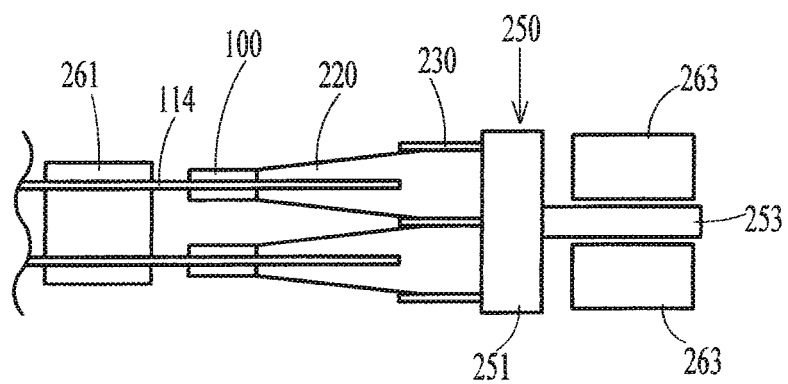
FIG. 8 is a side view of the head gimbal assembly of FIG. 7.
Figure 9:
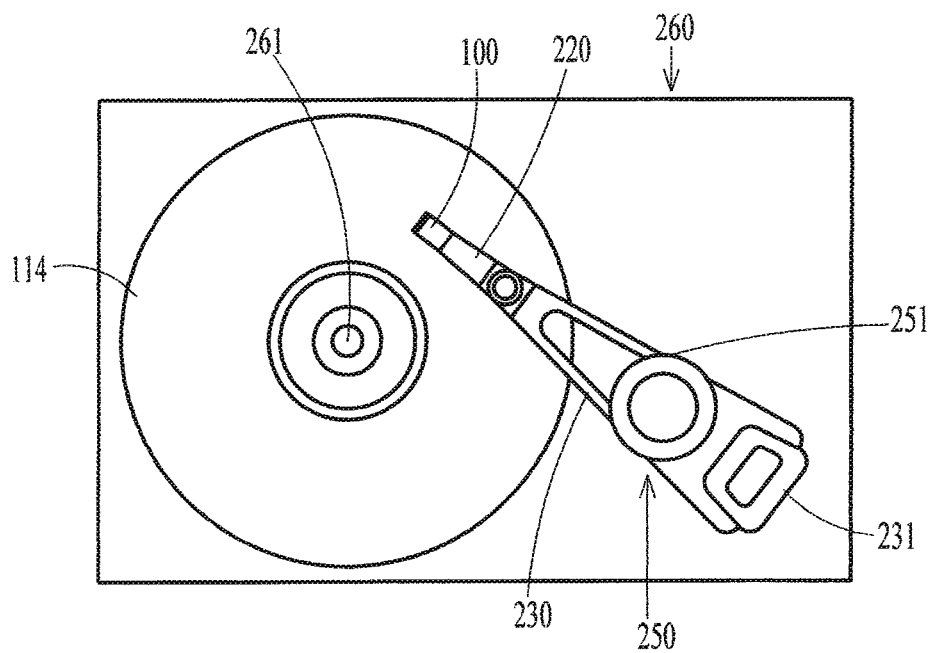
FIG. 9 is a plan view of a magnetic recording apparatus incorporating the head gimbal assembly of FIGS. 7 and 8.

Next, with reference to FIGS. 8 and 9, a head stack assembly and a magnetic recording apparatus where the magnetic recording head 100 is incorporated are explained. The head stack assembly is a member to which the HGA 220 is mounted to arms of a carriage having a plurality of arms, respectively. FIG. 8 is a side view of the head stack assembly, and FIG. 9 is a plan view of the magnetic recording apparatus. A head stack assembly 250 has a carriage 251 having a plurality of arms 230. The HGA 220 is mounted to each arm 230 at intervals so as to be aligned in the perpendicular direction. A coil 231 to be a portion of the voice coil motor is mounted at the opposite side of the arm 230 in the carriage 251. The voice coil motor has a permanent magnet 263 arranged at an opposite position across the coil 231.

With reference to FIG. 9, the head stack assembly 250 is incorporated into a magnetic recording apparatus 260. The magnetic recording apparatus 260 has a plurality of magnetic recording media 114 mounted to a spindle motor 261. For every magnetic recording medium 114, two magnetic recording heads 100 are arranged so as to be opposite to each other across the magnetic recording media 114. The head stack assembly 250 and the actuator except for the magnetic recording heads 100 correspond to a positioning device, and support the magnetic recording heads 100, and position the magnetic recording heads 100 relative to the magnetic recording media 114. The magnetic recording heads 100 are moved in the cross track direction of the magnetic recording media 114 by the actuator, and are positioned relative to the magnetic recording media 114. The magnetic recording head 100 records information into the magnetic recording media 114 by the magnetic recording element, and reproduces the information recorded in the magnetic recording media 114 by the MR element.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method, comprising:
   forming a stress modulating layer on a first electrode layer, wherein a material of the stress modulating layer is different from a material of the first electrode layer;
   forming a magnetic tunneling junction (MTJ) material stack on the stress modulating layer, and the forming of the MTJ material stack includes:
     forming a seed layer on the stress modulating layer,
     forming a pinned layer on the seed layer,
     forming a barrier layer on the pinned layer
     forming a free layer on the barrier layer, and
     forming a capping layer on the free layer;
   forming a second electrode layer on the MTJ material stack, wherein a material of the second electrode layer is different from the material of the stress modulating layer; and
   annealing the stress modulating layer, the MTJ material stack, the first electrode layer, and the second electrode layer.

2. The method of claim 1, wherein the stress modulating layer includes Zr, Hf, Al, or Mg.

3. The method of claim 1, wherein the stress modulating layer is about 10 nm in thickness.

4. The method of claim 1, wherein the stress modulating layer is a soft layer having low modulus of elasticity, wherein an elastic modulus of the stress modulating layer is about 50 Gigapascals (GPa).

5. The method of claim 1, wherein the barrier layer is a magnesium oxide tunnel barrier layer, and the free layer is a CoFe magnetic layer.

6. The method of claim 1, wherein the annealing includes applying a high temperature to the MTJ material stack to crystallize magnetic materials in the MTJ material stack.

7. The method of claim 1, wherein the first electrode layer is embedded within a dielectric layer, top surfaces of the first electrode layer and the dielectric layer being substantially coplanar.

8. The method of claim 1, wherein the stress modulating layer is a first stress modulating layer, further comprising:
forming a second stress modulating layer directly between the MTJ material stack and the second electrode layer, the second stress modulating layer having an elastic modulus between about 20 Gigapascals (GPa) and 400 GPa.

9. A method, comprising:
forming a magnetic tunneling junction (MTJ) material stack on a first electrode layer, and the forming of the MTJ material stack includes:
forming a seed layer on the first electrode layer,
forming a pinned layer on the seed layer,
forming a barrier layer on the pinned layer
forming a free layer on the barrier layer, and
forming a capping layer on the free layer;
forming a stress modulating layer on the MTJ material stack, wherein a material of the stress modulating layer is different from a material of the first electrode layer;
forming a second electrode layer on the stress modulating layer, wherein the material of the stress modulating layer is different from a material of the second electrode layer; and
annealing the stress modulating layer, the MTJ material stack, the first electrode layer, and the second electrode layer.

10. The method of claim 9, wherein the stress modulating layer includes Zr, Hf, Al, or Mg.

11. The method of claim 9, wherein the stress modulating layer is about 10 nm in thickness.

12. The method of claim 9, wherein the stress modulating layer is a soft layer having low modulus of elasticity, wherein an elastic modulus of the stress modulating layer is about 50 Gigapascals (GPa).

13. The method of claim 9, wherein the barrier layer is a magnesium oxide tunnel barrier layer, and the free layer is a CoFe magnetic layer.

14. The method of claim 9, wherein the annealing includes applying a high temperature to the MTJ material stack to crystallize magnetic materials in the MTJ material stack.

15. The method of claim 9, wherein the first electrode layer is embedded within a dielectric layer, top surfaces of the first electrode layer and the dielectric layer being substantially coplanar.

16. The method of claim 9, wherein the stress modulating layer is a first stress modulating layer, further comprising:
forming a second stress modulating layer directly between the first electrode layer and the MTJ material stack, the second stress modulating layer having an elastic modulus between about 20 Gigapascals (GPa) and 400 GPa.

17. A method, comprising:
forming a first electrode layer in a dielectric layer;
forming a first stress modulating layer over the first electrode layer;
forming a MTJ material stack over the first stress modulating layer;
forming a second stress modulating layer over the MTJ material stack;
forming a second electrode layer over the MTJ material stack; and
annealing the first electrode layer, the first stress modulating layer, the MTJ material stack, the second stress modulating layer, and the second electrode layer,
wherein the first electrode layer and the second electrode layer includes a first material, the first stress modulating layer and the second stress modulating layer includes a second material, and the first material is different from the second material.

18. The method of claim 17, wherein the forming of the MTJ material stack includes:
forming a seed layer over the first stress modulating layer;
forming a pinned layer over the seed layer;
forming a barrier layer over the pinned layer;
forming a free layer over the barrier layer; and
forming a capping layer over the free layer.

19. The method of claim 17, wherein the first stress modulating layer directly contacts the first electrode layer and the MTJ material stack.

20. The method of claim 17, wherein the second stress modulating layer directly contacts the second electrode layer and the MTJ material stack.

* * * * *